(12) United States Patent
Singer et al.

(10) Patent No.: US 10,867,977 B2
(45) Date of Patent: Dec. 15, 2020

(54) DISPLAY DEVICE AND METHOD FOR PRODUCING A DISPLAY DEVICE

(71) Applicant: OSRAM Opto Semiconductors GmbH, Regensburg (DE)

(72) Inventors: Frank Singer, Regenstauf (DE); Andreas Dobner, Wenzenbach (DE)

(73) Assignee: OSRAM OLED GMBH, Regensburg (DE)

( * ) Notice: Subject to any disclaimer, the term of this patent is extended or adjusted under 35 U.S.C. 154(b) by 123 days.

(21) Appl. No.: 16/186,395

(22) Filed: Nov. 9, 2018

(65) Prior Publication Data
US 2019/0157251 A1    May 23, 2019

(30) Foreign Application Priority Data

Nov. 17, 2017    (DE) .................. 10 2017 127 123

(51) Int. Cl.
*H01L 25/16* (2006.01)
*H01L 25/13* (2006.01)
(Continued)

(52) U.S. Cl.
CPC ............ *H01L 25/13* (2013.01); *H01L 25/165* (2013.01); *H01L 25/167* (2013.01);
(Continued)

(58) Field of Classification Search
CPC ... D05D 2303/40; H01L 25/13; H01L 25/165; H01L 25/167; H01L 2933/0033;
(Continued)

(56) References Cited

U.S. PATENT DOCUMENTS

| 5,632,631 A * | 5/1997 | Fjelstad | ............... | G01R 1/0466 |
| | | | | 257/E23.067 |
| 7,670,144 B2 * | 3/2010 | Ito | ................ | H05K 1/0287 |
| | | | | 439/37 |

(Continued)

FOREIGN PATENT DOCUMENTS

| CH | 700060 A1 | 6/2010 |
| DE | 102009031403 A1 | 1/2011 |
| DE | 102016122237 A1 | 5/2018 |

*Primary Examiner* — Long K Tran
(74) *Attorney, Agent, or Firm* — Slater Matsil, LLP (57) ABSTRACT

A display device and a method for producing a display device are disclosed. In an embodiment a display device includes a flat textile support and a plurality of optoelectronic semiconductor components disposed on the support. Each semiconductor component includes a connection substrate comprising a plurality of electrical connections, the plurality of electrical connections electrically connected via electrically conductive contact threads, wherein each electrical connection is realized by a contact hole which completely penetrates through the semiconductor component and, viewed in a plan view, is surrounded all around by the connection substrate and wherein, in each case, at least one contact thread runs through the contact hole so that the contact thread is arranged in part on an upper side of the semiconductor component facing away from the support, a plurality of semiconductor chips for generating light and at least one control unit for adjusting a color location of the light.

17 Claims, 9 Drawing Sheets

(51) Int. Cl.
*H01L 33/62* (2010.01)
*H01L 33/48* (2010.01)
*H05K 1/03* (2006.01)
*H05K 1/18* (2006.01)
*D05B 93/00* (2006.01)

(52) U.S. Cl.
CPC ............ *H01L 33/486* (2013.01); *H01L 33/62* (2013.01); *H05K 1/038* (2013.01); *H05K 1/18* (2013.01); *D05B 93/00* (2013.01); *D05D 2303/40* (2013.01); *H01L 2933/0033* (2013.01); *H01L 2933/0066* (2013.01); *H05K 2201/0281* (2013.01)

(58) Field of Classification Search
CPC ......... H01L 33/486; H01L 33/62; H05K 1/18; H05K 2201/0281
USPC .......................................................... 257/89
See application file for complete search history.

(56) References Cited

U.S. PATENT DOCUMENTS

2003/0211797 A1\* 11/2003 Hill ........................ H05K 1/189
 442/205
2011/0240091 A1 10/2011 Forster et al.

\* cited by examiner

DISPLAY DEVICE AND METHOD FOR PRODUCING A DISPLAY DEVICE

CROSS-REFERENCE TO RELATED APPLICATIONS

This application claims the benefit of German patent application 10 2017 127 123.6, filed on Nov. 17, 2017, which application is hereby incorporated herein by reference.

TECHNICAL FIELD

The invention relates to a display device. The invention further relates to a production method therefor.

SUMMARY

Embodiments provide a display device in which image points can be attached to a textile support in a high density.

According to at least one embodiment, the display device comprises one or more optoelectronic semiconductor components. The semiconductor components are in particular light-emitting diodes, LEDs for short. The semiconductor components can be configured as RGB LEDs. Red, green and blue light can preferably be generated independently of one another in the semiconductor components.

According to at least one embodiment, the display device comprises one or more supports. The at least one support is a flat textile, for example, a woven fabric. The fabric is based, for example, on a natural fiber such as cotton or can be based on synthetic fibers such as polyester or polyamide. Flat means, for example, that the support has dimensions of at least 5 cm×5 cm or 20 cm×20 cm. In particular, a lateral extent of the support exceeds, as seen in plan view and along a longitudinal direction and/or a transverse direction, a thickness of the support by a factor of at least 1000 or 100.

According to at least one embodiment, the semiconductor components each comprise a connection substrate. The connection substrate is, for example, a printed circuit board or PCB for short.

According to at least one embodiment, a plurality of electrical connections are located on the connection substrate. The semiconductor component can be electrically contacted via the electrical connections. In other words, the electrical connections represent external electrical contact possibilities. The electrical connections are formed, for example, by metallizations and/or electrical through holes, also referred to as vias.

According to at least one embodiment, the semiconductor components each comprise a plurality of semiconductor chips, especially light-emitting diode chips. The semiconductor chips are provided for generating light. Preferably, at least one semiconductor chip for generating red light, at least one semiconductor chip for generating green light and at least one semiconductor chip for generating blue light are present.

According to at least one embodiment, the semiconductor components each have one or more control units. The at least one control unit is designed to adjust the color locus of the overall light which is generated by the semiconductor chips. The control unit is preferably an integrated circuit, IC for short. Control signals for controlling the display device and the semiconductor components can be sent to the control unit from outside the display device temporarily or continuously. Said control signals are preferably converted into operating signals for the semiconductor chips and the semiconductor chips are correspondingly supplied with current, for example, by setting a current intensity or by setting switch-on times, for example, by means of pulse width modulation, PWM for short.

According to at least one embodiment, the semiconductor components are stitched onto the support. This means that a connection between the semiconductor components and the support is effected via at least one thread which is pulled through the respective semiconductor component and the support. In other words, the semiconductor components are sewn onto the support. It is possible for the single mechanical and/or electrical connection between the semiconductor components and the support to be achieved via the stitching. Alternatively, in assistance of stitching, it is possible for the semiconductor components to be adhesively bonded or fused to a material of the support.

According to at least one embodiment, the electrical connections or at least part of the electrical connections of the semiconductor components or of part of the semiconductor components are electrically established via electrically conductive contact threads. The contact threads are preferably processed by means of stitching. The contact threads are preferably mechanically flexible. It is possible that the contact threads are continuously electrically conductive on a surface, or that the contact threads have only individual areas which are electrically conductive towards the outside and are otherwise electrically insulating on a surface towards the outside.

In at least one embodiment, the display device comprises a plurality of optoelectronic semiconductor components on a support. The support is a flat textile. The semiconductor components each have a connection substrate having a plurality of electrical connections and a plurality of semiconductor chips for generating light. The semiconductor components each comprise at least one control unit for adjusting the color locus of the light generated during operation. The semiconductor components are stitched onto the support. The electrical connections are electrically established via electrically conductive contact threads.

For the use of light-emitting diodes in intelligent or smart textiles, sequins can be equipped with light-emitting diode chips and stitched onto a textile. In order to achieve a high pixel density or density of image points, the sequins have to have certain minimum dimensions and have to be mounted close to one another.

The optoelectronic semiconductor components described here for the display device are preferably designed as sequins. In particular, one or more RGB LEDs and one or more control units are integrated into the sequins and packaged in a belt after completion. By adapting an embroidery with a push-out, the sequins can be pressed out of the belt during the embroidery process and can be processed during the embroidery process. In this way, display devices, also referred to as displays, can be equipped and produced at a narrow, regular distance with the semiconductor components so that a high density of image points per unit area can be achieved.

Such display devices can be used, for example, in the textile sector, for example, as variably adjustable patterns, signals or images. In particular, corresponding display devices can be used for safety clothing. Furthermore, such display devices can be used in the automobile sector, for example, for designing an interior area of automobiles. In addition, use in medical technology, for example, in the field of light therapy, is possible.

According to at least one embodiment, the electrical connections or at least some of the electrical connections are each realized by contact holes. The contact holes preferably completely penetrate the associated semiconductor component. Viewed in a plan view, the contact holes are surrounded all around by the associated connection substrate. That is, the contact holes are located within the connection substrate, seen in plan view.

According to at least one embodiment, at least one contact thread runs through the associated contact hole. In this case, the contact threads are preferably arranged in part on top sides of the semiconductor components which are remote from the support. The contact threads can thus run on the upper sides and/or between the support and the semiconductor components and/or on an inner side of the support facing away from the semiconductor components. Preferably, the contact threads alternate several times a plane in which they run. The contact threads can be arranged in accordance with a sewing pattern or an embroidery pattern.

According to at least one embodiment, the semiconductor components each have a plurality of image points that can be electrically controlled independently of one another. That is to say that the semiconductor chips of the semiconductor components are each grouped into the image points. Grouping can mean that the semiconductor chips are closer to one another within the image points than a mean distance between adjacent image points. The image points are preferably arranged regularly within the semiconductor components, for example, in a square grid.

According to at least one embodiment, the image points, also referred to as pixels, are arranged in a uniform, regular pattern over the semiconductor components. This means that the image points of several or of all semiconductor components taken together are arranged in a preferably square or rectangular or hexagonal pattern. The image points can thus be arranged, even over a plurality of semiconductor components, in regular rows and columns in order to construct a display panel such as a display.

According to at least one embodiment, the semiconductor components are arranged offset with respect to one another so that the semiconductor components are arranged in a different basic pattern than the image points. For example, the image points are arranged as a whole in a square or rectangular basic pattern, whereas the semiconductor components are arranged in a hexagonal pattern. In particular, adjacent rows of the semiconductor components are displaced relative to one another by half a diameter of the semiconductor components. By means of different basic patterns of the arrangement of the semiconductor components and of the image points, a regular grid of the image points can be achieved with semiconductor components of geometrically simple construction. In addition, the semiconductor components can be arranged more densely.

According to at least one embodiment, the image points are each constructed as RGB units. This means that at least one semiconductor chip is present for generating red light, at least one semiconductor chip is present for generating green light, and at least one semiconductor chip is present for generating blue light. It is also possible for a plurality of semiconductor chips of a specific color to be present, for example, two semiconductor chips for generating green light, also referred to as an RGGB unit.

The semiconductor chips can directly generate the corresponding light color so that the corresponding light color is already produced in a semiconductor layer sequence. Alternatively, it is possible for all semiconductor chips to generate light of the same color in a semiconductor layer sequence, for example, near ultraviolet light or blue light, which is then converted into red light, into green light and optionally into blue light via suitable phosphors. The semiconductor layer sequences are based, for example, on AlInGaN, AlInGaP and/or AlInGaAs.

According to at least one embodiment, the semiconductor components or at least some of the semiconductor components have n×n of the image points. In this case, n is a natural number. n is preferably an even number. In particular, n=2 or n=4 or n=6.

According to at least one embodiment, all the semiconductor components of the display device or in at least one display area of the display device are of the same design, at least with regard to the arrangement of the image points. If a plurality of rows of semiconductor components are present, then it is possible that only every second row is equipped with semiconductor components of the same design so that in total two different types of semiconductor components can be present.

According to at least one embodiment, the semiconductor components each have at least one fastening hole. The fastening hole is, for example, an electrically passive fastening hole that does not fulfill an electrical function. Alternatively, the fastening hole can be at the same time a contact hole, which, however, preferably has a larger average diameter than the remaining contact holes, for example, a diameter larger by a factor of at least 1.5 and/or by a factor of at most 3.

According to at least one embodiment, at least one electrically non-conductive fastening thread runs through the fastening hole. The fastening thread serves for mechanically fastening the relevant semiconductor component to the support, in particular exclusively for a mechanical fastening and/or for a correct orientation of the semiconductor component relative to the support.

According to at least one embodiment, the fastening hole is arranged centrally in the associated semiconductor component. For example, a center point of the fastening hole coincides with a geometric center of the connection substrate. The fastening hole preferably has a larger diameter than the contact holes or than the remaining contact holes. The contact holes are arranged regularly or irregularly around the fastening hole, as can be the case for the image points. An arrangement of the image points is preferably symmetrical around the fastening hole, at least in the case of a plurality of image points on the associated semiconductor component.

According to at least one embodiment, some of the semiconductor components or all the semiconductor components are electrically connected in series via at least some of the contact threads. For example, a data signal for the semiconductor components is looped through the relevant semiconductor components. Alternatively or additionally, the semiconductor components can be electrically connected in parallel with respect to a supply voltage and/or an earth contact.

According to at least one embodiment, in a plan view the electrical contact threads do not intersect. This applies in particular to a side of the semiconductor components facing away from the support. Furthermore, it is possible that crossings between the contact threads are generally avoided. This is particularly the case if only two electrical connections are present per semiconductor component.

Alternatively, it is possible for different contact threads to intersect when the display device is viewed in a plan view. At the crossing points of the respective contact threads, the latter preferably do not lie in a common plane, but are located on different sides of the semiconductor components and/or of the support so that electrical shorts are avoided.

According to at least one embodiment, the contact threads or some of the contact threads run oblique to arrangement lines of the semiconductor chips. The arrangement lines preferably run straight. The arrangement lines can be rows and/or columns in which the semiconductor chips and/or the image points are arranged.

According to at least one embodiment, the semiconductor components each have three, four, five or six of the connections, preferably three or five connections. Said connections are preferably electrically contacted to the contact threads by means of stitching. It is thus possible for electrical contacting to take place exclusively via the contact threads.

According to at least one embodiment, a conductor track or a plurality of electrical conductor tracks is mounted on a support outer side of the support facing the semiconductor components. The at least one conductor track of the support is formed, for example, by electrically conductive fibers or threads which are fixedly integrated in a fabric of the support. It is possible for the conductor tracks of the support to extend only partially freely accessible on the outer side of the support and to be otherwise concealed in an interior of the support, for example, woven in.

According to at least one embodiment, at least one of the electrical terminals of the associated semiconductor components is electrically contacted via the conductor track on the support outer side. In this way, an electrical contact can be made via the conductor track on the outer side of the support in addition to an electrical contacting via the contact threads.

According to at least one embodiment, the conductor track has an enlarged thickness on the outer side of the support in the region of the electrical connections. For example, the conductor track is designed to be hill-shaped at the connections. As a result, an improved contact can be achieved between the conductor track on the support outer side and the associated electrical connections.

An electrical contact between the conductor track and the relevant semiconductor component is preferably affected only by means of pressing on account of the sticking of the semiconductor components to the support. This means that preferably no additional contact material such as an electrically conductive adhesive or a solder is present.

According to at least one embodiment, the semiconductor components are circular or oval in plan view.

According to at least one embodiment, the semiconductor components, seen in plan view, have a polygon as a basic shape, preferably a regular polygon. A number of corners of the polygon is preferably between three and eight, for example, exactly four or six. In this case, the corners of the polygon are preferably rounded. By means of round corners, damage to the support through the semiconductor component can be avoided.

According to at least one embodiment, the semiconductor components each have one or more fixing notches. Preferably, exactly two fixing notches are provided. The fixing notches, when viewed in plan view, are located on an outer edge of the connection substrate and thus on an outer edge of the associated semiconductor component. The fixing notches are preferably provided for fixing an orientation of the semiconductor components on the support and relative to the support. In particular, in each case at least one of the threads is in one of the fixing notches.

According to at least one embodiment, the fixing notches are electrically insulating. The fixing notches therefore have no electrical function. Alternatively, the fixing notches can be electrically functionalized and serve, for example, as an electrical connection point.

According to at least one embodiment, the contact threads and/or the fastening threads are composed of a plurality of fibers. For example, at least 15 or 25 or 50 and/or at most 200 or 100 or 50 of the fibers are present per contact thread or per fastening thread. An average diameter of the threads is alternatively or additionally at least 50 µm or 0.1 mm and/or at most 0.3 mm or 0.2 mm.

According to at least one embodiment, the semiconductor components have an average diameter of at least 2 mm or 3 mm or 4 mm when viewed in plan view. Alternatively or additionally, this average diameter is at most 10 mm or 7 mm or 5 mm. In other words, the semiconductor components, which are preferably sequins, are comparatively small.

According to at least one embodiment, an average diameter of the connections, that is in particular of the contact holes, is at least 0.2 mm or 0.3 mm or 0.6 mm. Alternatively or additionally, this average diameter is at most 2 mm or 1 mm or 0.8 mm. The average diameter of the contact holes and optionally also of the fastening hole can be greater by a factor of at least 3 or 4 than an average diameter of the associated thread. Thus, for example, the contact thread can run several times through the respective contact hole and/or fastening hole.

According to at least one embodiment, the fibers each have an electrically insulating fiber core, for example, made of polyimide. In the case of the contact threads, an electrically conductive fiber casing is located around the fiber core, for example, from a metal such as silver or aluminum. Optionally, it is possible for the fiber casing or the contact thread to be partially covered by an electrically insulating casing, for example, by a plastic such as polyethylene.

According to at least one embodiment, at least 10 or 100 and/or at most 10000 or 1000 of the semiconductor components are attached to the support. In this way, a display having a comparatively low resolution can be efficiently achieved.

According to at least one embodiment, the support is mechanically flexible. This means that the support can be folded and/or crumpled and/or bent like a material for a garment.

According to at least one embodiment, at least one of the semiconductor components or some of the semiconductor components or all of the semiconductor components has/have an antenna. The antenna is designed to receive control signals, in particular is designed only for receiving control signals. The relevant semiconductor component can thus be used for a radio control. Signal lines can thus be avoided. However, an electrical power supply of the semiconductor components takes place particularly preferably via the contact threads, so that the antenna is designed exclusively for radio control and not for power supply.

According to at least one embodiment, some or all of the semiconductor components are located between the support and a covering material. The covering material is preferably translucent. The covering material can be designed as a continuous layer and can completely cover the semiconductor components and/or the support over the whole area. For example, the covering material is a foil or a textile that is a woven material.

According to at least one embodiment, the covering material comprises at least one electrical conductor track. Said conductor track is electrically connected to at least one or to some or to all of the semiconductor components. This results in an electrical contacting of the semiconductor components, in addition to the contact threads, in this case via the at least one conductor track of the cover material, optionally additionally via the at least one conductor track of the support.

According to at least one embodiment, the covering material is designed to be light-diffusing. For example, the covering material is milky turbid. As a result, it is possible for a more uniform luminous pattern to be generated by the display device. Because of the covering material, the semiconductor components can likewise be less or not at all recognizable for a viewer so that an improved visual impression of the display device is possible. For example, when the semiconductor components are switched off, the covering material is opaque to a viewer. Thus, during operation, for example, only the semiconductor chips which can generate light of a relatively high intensity can optically penetrate the covering material.

Embodiments provide a method for producing a display device, as described in connection with one or more of the preceding embodiments. Features of the method are therefore also disclosed for the display device and vice versa.

In at least one embodiment, the method comprises the step of providing the support and the semiconductor components. According to the method, the semiconductor components are stitched onto the support. During the stitching, both a mechanical fastening and an electrical contacting of the semiconductor components are carried out. In this case, the contact threads and one or more fastening threads can be used.

According to at least one embodiment, the semiconductor components are provided in one or in a plurality of belts. The at least one belt can be a so-called endless belt which comprises several hundred or several thousand of the semiconductor components. The semiconductor components are preferably arranged linearly in the belt. The belt can be designed as a one-way belt so that the belt can be discarded after the removal of the semiconductor components.

According to at least one embodiment, the semiconductor components are pressed out of the belt by means of an embroidery needle. The embroidery needle is preferably provided with a push-out. The push-out is made, for example, of a comparatively soft material such as rubber, in order not to damage the semiconductor components during pushing-out.

According to at least one embodiment, the belt is designed to be divisible and/or is separated after the embroidery process or after the pushing-out process. Since the thread usually hangs on the needle and the belt would otherwise collide with the thread, a more efficient stitching is possible by means of a divisible or separable belt.

The push-out is arranged in particular along a longitudinal axis of the embroidery needle relatively far away from a guide hole for a thread so that the push-out is used only when the semiconductor components are pressed out of the belt and otherwise does not exert any further function during stitching. The push-out is designed, for example, as a circular disk.

BRIEF DESCRIPTION OF THE DRAWINGS

A display device described here and a method described here are explained in more detail below with reference to the drawing on the basis of exemplary embodiments. Identical reference sings indicate the same elements in the individual figures. However, no relationships to scale are illustrated, but rather individual elements can be represented with an exaggerated size in order to afford a better understanding.

In the figures:

FIGS. 2A and 2B, collectively FIG. 2, show schematic plan views of exemplary embodiments of display devices;

FIGS. 3A and 3B, collectively FIG. 3, show schematic perspective representations of exemplary embodiments of optoelectronic semiconductor components for a display device;

FIGS. 9A to 9C, collectively FIG. 9, show schematic plan views of exemplary embodiments of optoelectronic semiconductor components for display devices;

FIGS. 10A and 10B, collectively FIG. 10, and FIG. 11 show schematic illustrations of electrical interconnections of optoelectronic semiconductor components for exemplary embodiments of display devices;

FIGS. 12A to 12C, collectively FIG. 12, and FIG. 13 show schematic plan views of exemplary embodiments of optoelectronic semiconductor components for display devices;

FIGS. 14A and 14B, collectively FIG. 14, show schematic perspective representations of method steps of a method for producing display devices;

FIG. 15 shows a schematic plan view of an exemplary embodiment of a display device; and FIG. 16 shows a schematic plan view of an exemplary embodiment of a display device.

DETAILED DESCRIPTION OF ILLUSTRATIVE EMBODIMENTS

Figure 1:
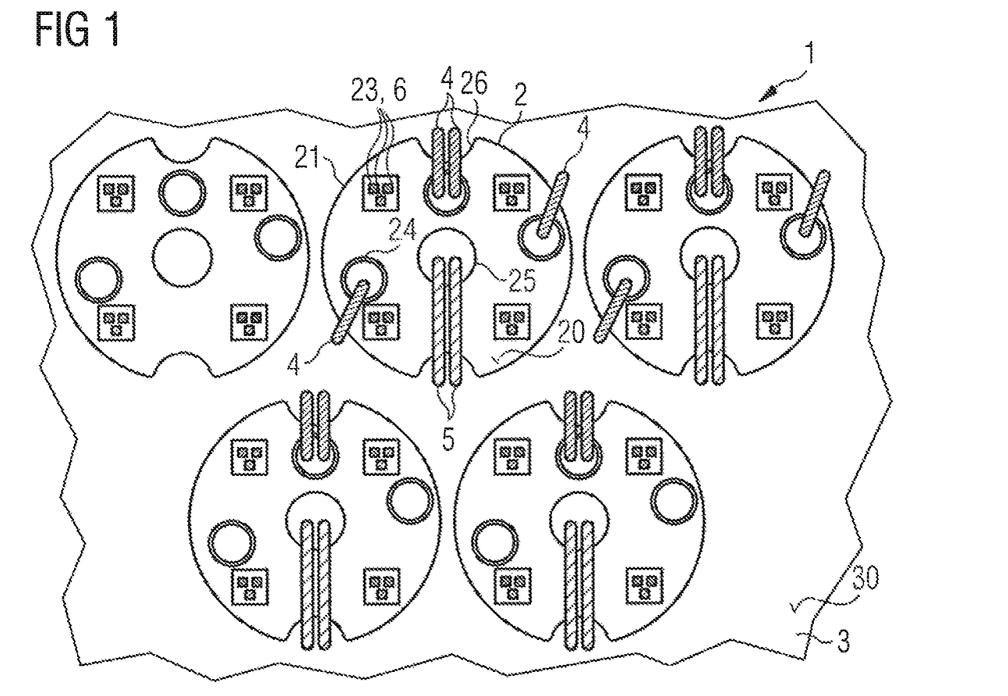
FIG. 1 shows a schematic plan view of an exemplary embodiment of a display device.

FIG. 1 shows an exemplary embodiment of a display device 1. The display device 1 comprises a support 3 having a support outer side 30. The support 3 is a woven material. A plurality of optoelectronic semiconductor components 2 are located on the outer side 30 of the support 3, said optoelectronic semiconductor components 2 being sequins.

The semiconductor components 2 each comprise a connection substrate 21 on which a plurality of image points 6, also referred to as pixels, are applied. The four image points 6, for example, are arranged in a square pattern on the connection substrate 21. The semiconductor component 2 can emit colored light by means of the image points 6, which can be controlled independently of one another. The image points 6 each have a plurality of semiconductor chips 23 for generating light and are preferably designed as RGB elements.

Furthermore, a plurality of contact holes 24, which represent electrical connections, are located in the connection substrate 21. The contact holes 24 are grouped around a central fastening hole 25. The fastening hole 25 has a larger diameter than the circular contact holes 24.

All semiconductor components 2 are identically oriented on the support 3. The semiconductor components 2 are fastened to the support 3 mainly by means of fastening threads 5, which are guided through the central fastening hole 25. Furthermore, a plurality of electrically conductive contact threads 4 are provided, which are guided through the contact holes 24. The semiconductor components 2 are electrically connected via the contact threads 4.

The contact holes 24 are designed, for example, as supply voltage, ground line and data connection. The threads 4, 5 run partially on an upper side 20 of the semiconductor components 2 facing away from the support 3 and can also be covered by the support 3 so that the threads 4, 5 are exposed only to a comparatively small proportion on the outer side 30 of the support 3, and can otherwise run within the support 3 or can be concealed by the support 3.

The contact threads 4 contribute to a mechanical fixing of the semiconductor components 2 to the support 3 preferably less than the fastening threads 5. Thus, a mechanical fixing of the semiconductor components 2 to the support 3 is achieved predominantly by the fastening threads 5.

Optionally, the connection substrates 21 each preferably have two fixing notches 26. The fixing notches 26 are located on opposite sides of the connection substrate 21. By means of the optional fixing notches 26, an orientation of the semiconductor components 2 relative to the support 3 can be determined solely by means of the fastening threads 5. In this way, the semiconductor components 2 can first be fastened to the support 3 via the fastening threads 5 and the electrical interconnection is only carried out via the contact threads 4. This makes it possible to achieve a high degree of precision in the electrical interconnection by means of the contact threads 4.

In order to simplify the representation, not all threads 4, 5 which are necessary for the mechanical fastening and for the electrical connection of the semiconductor components 2 are drawn in FIG. 1. The same applies to the other figures.

Figure 2A:
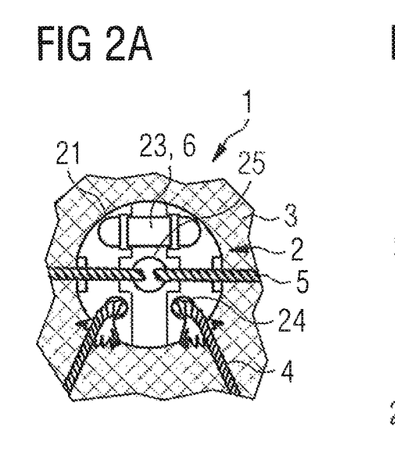

In the example of FIG. 2A, only one of the semiconductor components 2 is shown in order to simplify the illustration. Said semiconductor component 2 has only one image point 6 which is designed as an SMD RGB LED. The fastening threads 5 run horizontal, the contact threads 4 are of V-shaped design and lie only on one side of the fastening thread 5. Furthermore, it can be seen in FIG. 2 that the support 3 is formed from a woven fabric. Unlike in FIG. 1, the semiconductor component 2 of FIG. 2 has only two of the contact holes 24.

In terms of circuitry, should it not be possible to avoid conductive contact threads crossing each other, thus, at crossing points an insulating layer can be stitched with an electrically non-conductive insulating thread 55, and a further electrically conductive contact thread 4 can then be stitched over it. This is illustrated in the exemplary embodiment of FIG. 2B.

Figure 2B:
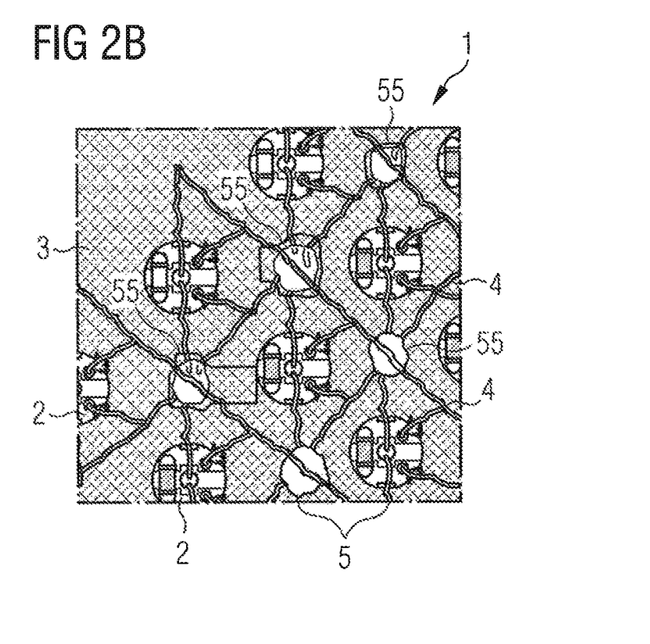

Thus, in FIG. 2B, the fastening threads 5 run from top to bottom, whereas the contact threads 4 are arranged in a diagonal grid pattern. The contact threads 4 running from the bottom left to the top right are located directly on the woven support 3, followed by preferably hip-shaped, locally produced weaving points with the insulating threads 55, in turn followed by the further contact threads 4, which run diagonally from the top left to the bottom right. Otherwise, the statements relating to FIG. 2A and to FIG. 1 apply. Such insulating threads 55 can, if necessary, also be present in all other exemplary embodiments.

Figure 3A:
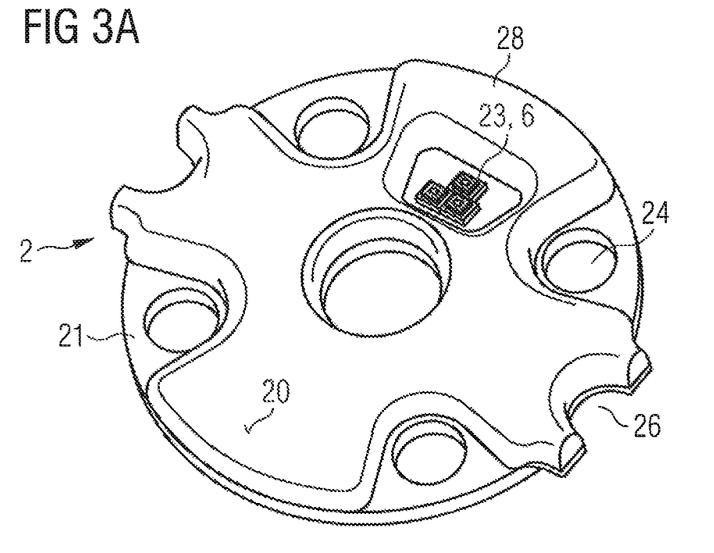
Figure 3B:
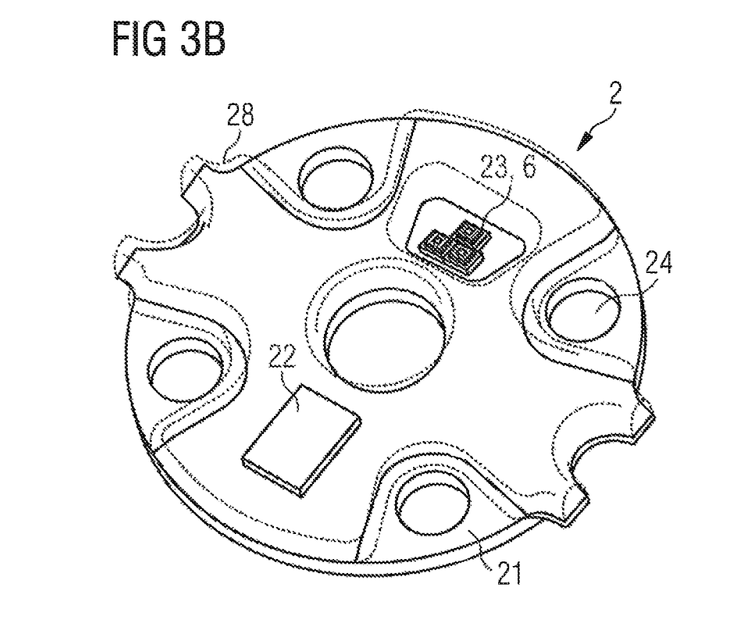

FIGS. 3A and 3B show further exemplary embodiments of the semiconductor components 2. As in all the exemplary embodiments, the semiconductor components 2 are preferably in the form of sequins. Four contact holes 24 are provided, for example, which are arranged uniformly around the central fastening hole 25. In addition, the semiconductor component 2 has a potting 28, which thickens and mechanically reinforces the connection substrate 21. A high mechanical stability and bending stiffness can be achieved by the potting 28.

The contact holes 24 are located, for example, in U-shaped cutouts of the potting 28 so that the contact holes 24 are surrounded by a material of the potting 28 only on three sides. The semiconductor chips 23 of the image point 6 are preferably located in a reflector-shaped recess of the potting 28.

According to FIG. 3A, the potting 28 is white and diffusely reflective for the light generated by the semiconductor chips 23. In FIG. 3B, on the other hand, it can be seen that the potting 28 is light-transmissive, preferably transparent.

Furthermore, it can be seen from FIG. 3B that a control unit 22 is integrated in the potting 28. Such a control unit 22 is also present in all other exemplary embodiments. The control unit 22 is, for example, an IC, a microcontroller or an ASIC. The semiconductor chips 23 are controlled in a targeted manner by means of the control unit 22.

Figure 4:
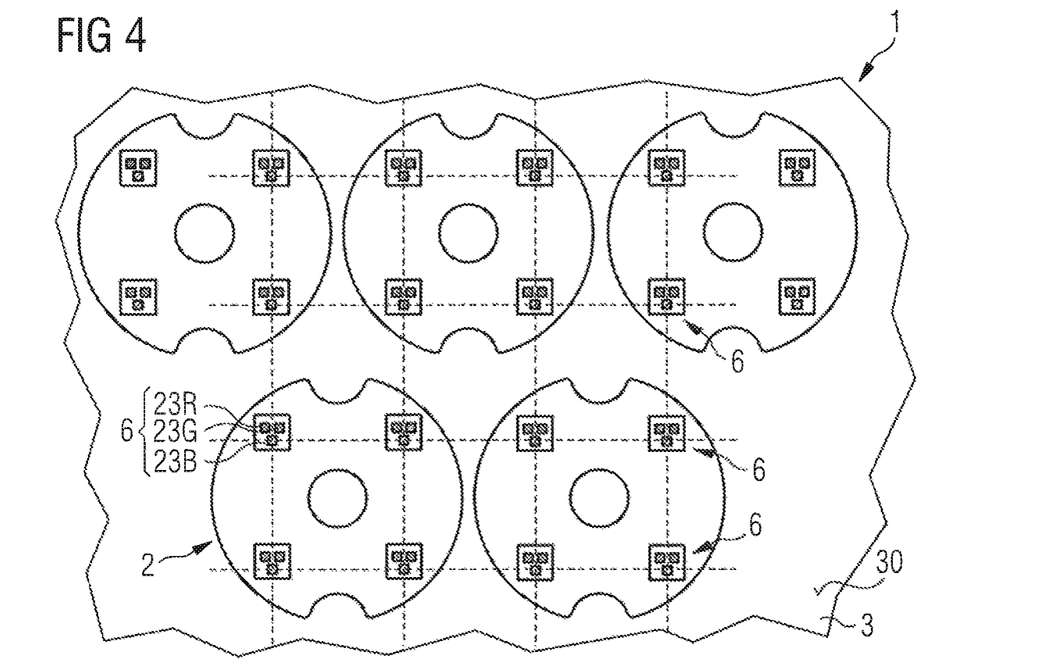
FIGS. 4-6, FIG. 15 and FIG. 16 show schematic plan views of exemplary embodiments of display devices.

In the exemplary embodiment of FIG. 4 it is illustrated that the image points 6 each have a semiconductor chip 23R for generating red light, a semiconductor chip 23B for generating blue light and a semiconductor chip 23G for generating green light. The semiconductor chips 23R, 23B, 23G are each arranged closely adjacent to one another within the image points 6. Adjacent image points 6, on the other hand, are spaced apart from each other comparatively far. All image points 6 are arranged over the semiconductor components 2 in a regular square grid. In order to achieve this, the semiconductor components 2 are arranged offset with respect to one another in adjacent rows by approximately half a diameter of the semiconductor components 2. The semiconductor components 2 thus form a hexagonal grid.

In order to simplify the representation, the threads 4, 5 are not shown in FIG. 4, nor are the contact holes 24.

Figure 5:
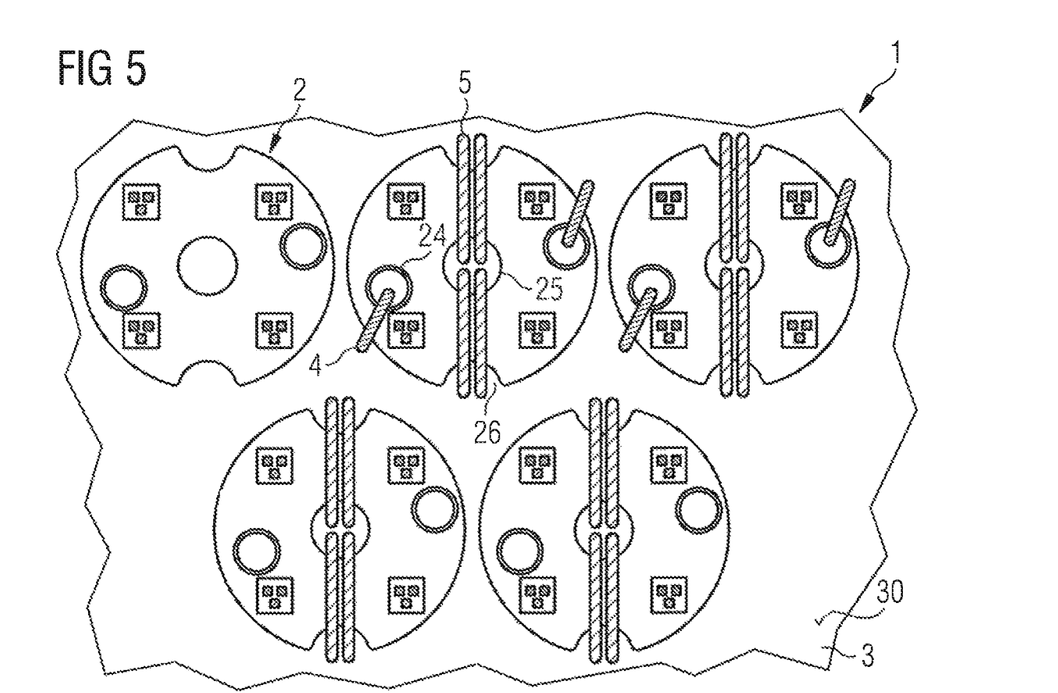

In the case of the exemplary embodiment of the display device 1 as illustrated in FIG. 5, the semiconductor components 2 each have two contact holes 24, which are arranged in the center between the four image points 6. A mechanical fastening takes place via the fastening thread 5, which can be guided in a straight line over the fastening hole 25 and the fixing notches 26.

Furthermore, two of the contact threads 4 are provided for each semiconductor component 2. The contact threads 4 serve for a ground connection and for a supply voltage. The data for controlling the image points 6 are modulated, for example, onto the supply voltage. In order to avoid short circuits, the contact threads 4 can run parallel to one another and can thus be arranged without crossing. This applies overall or at least to the course of the contact threads 4 on the outer side 30 of the support 3.

Figure 6:
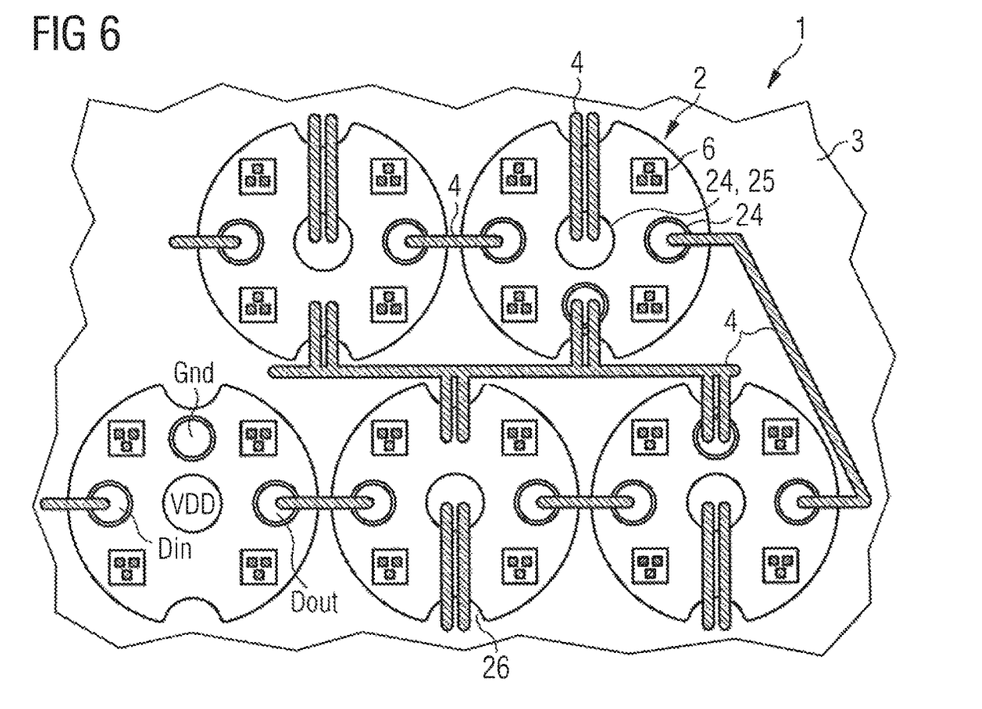

In the exemplary embodiment of FIG. 6 it is illustrated that the central fastening hole 25 is simultaneously a contact hole 24 and thus electrically functionalized. The total of four contact holes 24 are used as the supply voltage Vdd, as the ground connection Gnd and as the data input Din and as the data output Dout.

The contact threads 4 for the ground connection Gnd and the supply voltage Vdd run, for example, in each case between adjacent rows. The contact threads 4 for data transmission, which are connected to the contact holes 24 for Din, Dout, are electrically looped through the semiconductor components 2 and run centrally along the rows of semiconductor components 2. Further, it is indicated in FIG. 6 that adjacent rows are interconnected in series by an approximately U-shaped course of the contact thread 4 for the data line.

The semiconductor components 2 in adjacent rows are preferably rotated by 180° relative to one another. Thus, with regard to the contact thread 4, rows adjacent to the data line can be efficiently interconnected. For example, a data running direction in FIG. 6 is oriented from right to left in the upper row of the semiconductor components 2 and from left to right in the lower row.

Correspondingly, the ground terminals Gnd in the upper row of semiconductor components 2 are to be found at the bottom and in the lower row at the top. The semiconductor components 2 are mechanically fixed in particular via the contact thread 4 for the supply voltage Vdd and optionally via one of the fixing notches 26 in the respective semiconductor component 2.

Figure 7A:
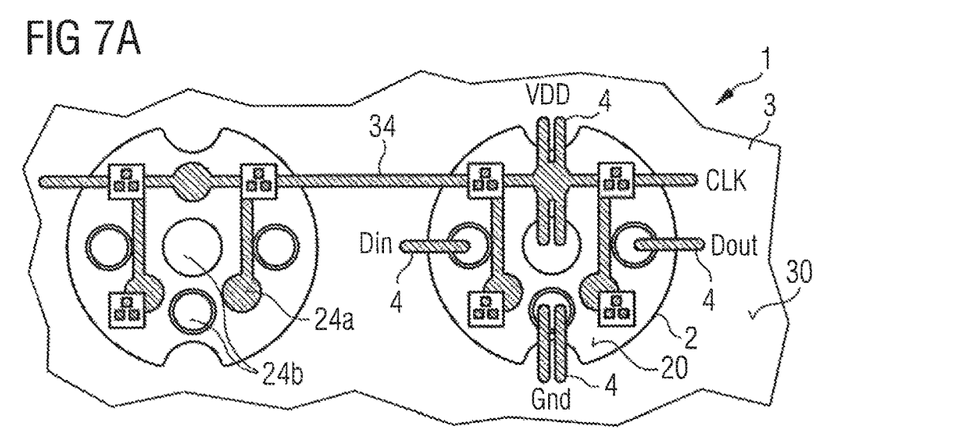
FIG. 7A shows a schematic plan view.
Figure 7B:
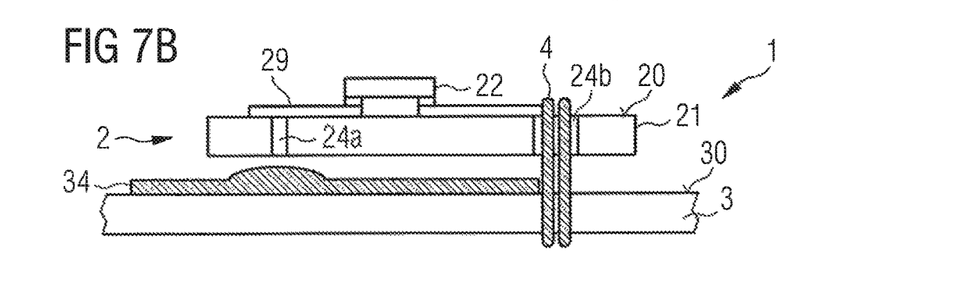
FIG. 7B shows a schematic sectional illustration of an exemplary embodiment of a display device.

FIG. 7 shows that a conductor track 34 is attached to the outer side 30 of the support 3. The conductor track 34 runs between the support 3 and the semiconductor components 2. In the region of one of the electrical connections 24a, the conductor track 34 can have an elevation in order to facilitate electrical connection, see FIG. 7B. The contact thread 4 is preferably guided through the connection substrate 21 and through the support 3. Electrical connections 29 are located on the upper side 20 of the connection substrate 21. The connections 29 are designed as plated-through holes and as conductor tracks, in particular in order to drive the control unit 22.

The connections 24a for the conductor track 34 are preferably designed as a three-point support, see FIG. 7A, in order to achieve a high level of redundancy and security during the contacting of the semiconductor components 2 to the conductor track 34. The remaining contact threads 4 for electrical connection are led beyond the conductor track 34 without electrical contact.

The electrical connection 24a for the conductor track 34 does not need to be designed as a contact hole through the semiconductor component 2, since no thread 4, 5 is guided through at this connection 24a. In contrast, the connections for the threads 4, 5 are designed as contact holes 24b through the semiconductor component 2.

Optionally, as in all other exemplary embodiments, a clock generator (clock or Clk for short) can be present. In the example of FIG. 7, the conductor track 34 is designed as a clock generator Clk.

Figure 8:
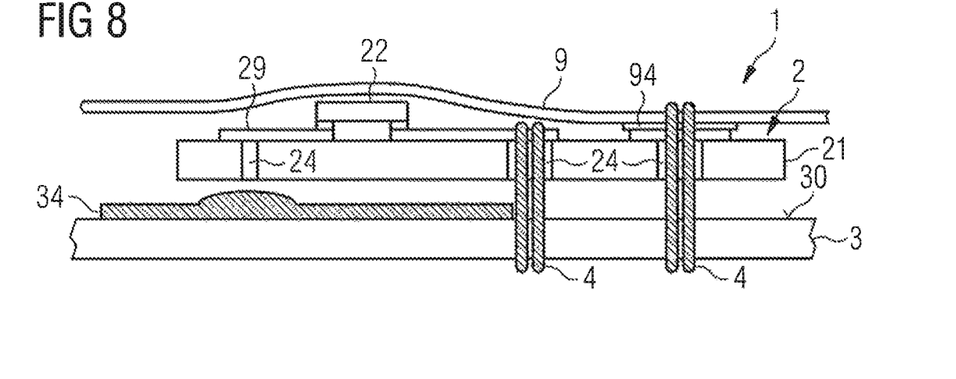
FIG. 8 shows a schematic sectional illustration of an exemplary embodiment of a display device.

FIG. 8 illustrates that additionally a covering material 9, for example, a foil or a fabric, is present. The covering material 9 is preferably diffusely scattering. A conductor track 94 or even a plurality of such conductor tracks can be located on an inner side of the cover material 9 facing the support 3. A further degree of freedom in the electrical interconnection of the semiconductor components 2 and in the contacting thereof is provided by means of such a conductor track 94.

A corresponding covering material can also be present in all other exemplary embodiments.

Figure 9A:
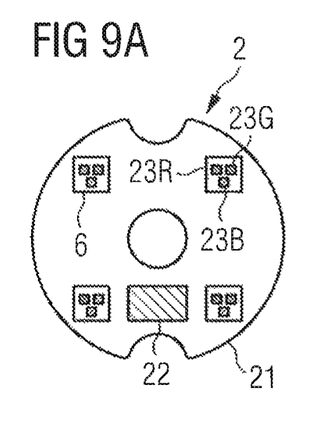
Figure 9B:
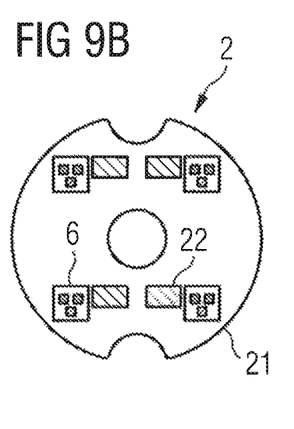
Figure 9C:
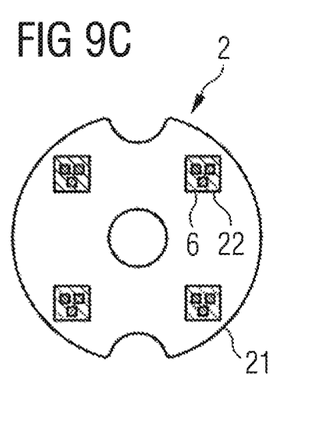

FIG. 9 illustrates that the image points 6 comprising the semiconductor chips 23R, 23G, 23B can be arranged differently relative to the control unit 22. According to FIG. 9A, precisely one control unit is present which is responsible for all image points 6. In contrast, in FIG. 9B one control unit 22 is present per image point 6, the control units 22 being arranged closely adjacent to their associated image points 6. In FIG. 9C, the image points 6 are arranged on the associated control unit 22 so that, as in FIG. 9B, a one-to-one assignment exists between the control units 22 and the image points 6.

Figure 10A:
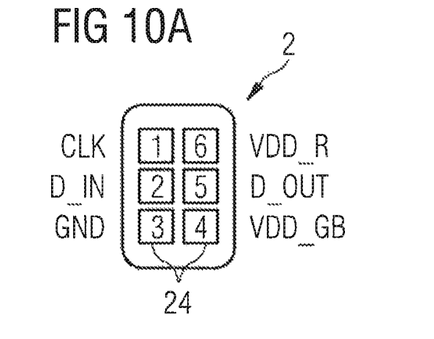
Figure 10B:
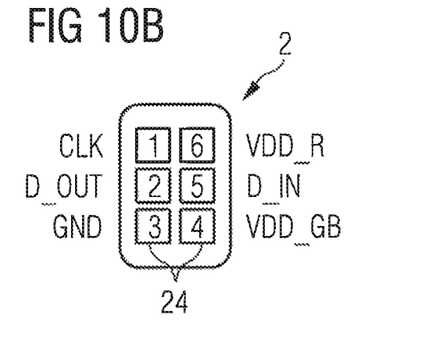

FIGS. 10A and 10B illustrate two types of semiconductor components 2, focusing on the connections 24. The two semiconductor components 2 of FIGS. 10A and 10B can be used alternately in the rows of the exemplary embodiment of FIG. 6, for example. In particular, the data inputs Din and data outputs Dout are oriented differently.

Furthermore, it is shown that different connections for the supply voltage Vdd can be present. Thus, a supply voltage Vdd_GB for green and blue-emitting semiconductor chips 23 can be present and a separate supply voltage Vdd_R for the red-emitting semiconductor chips 23. It can thus be taken into account that the semiconductor chips 23R, 23G, 23B can be based on different semiconductor material systems and require different supply voltages.

Figure 11:
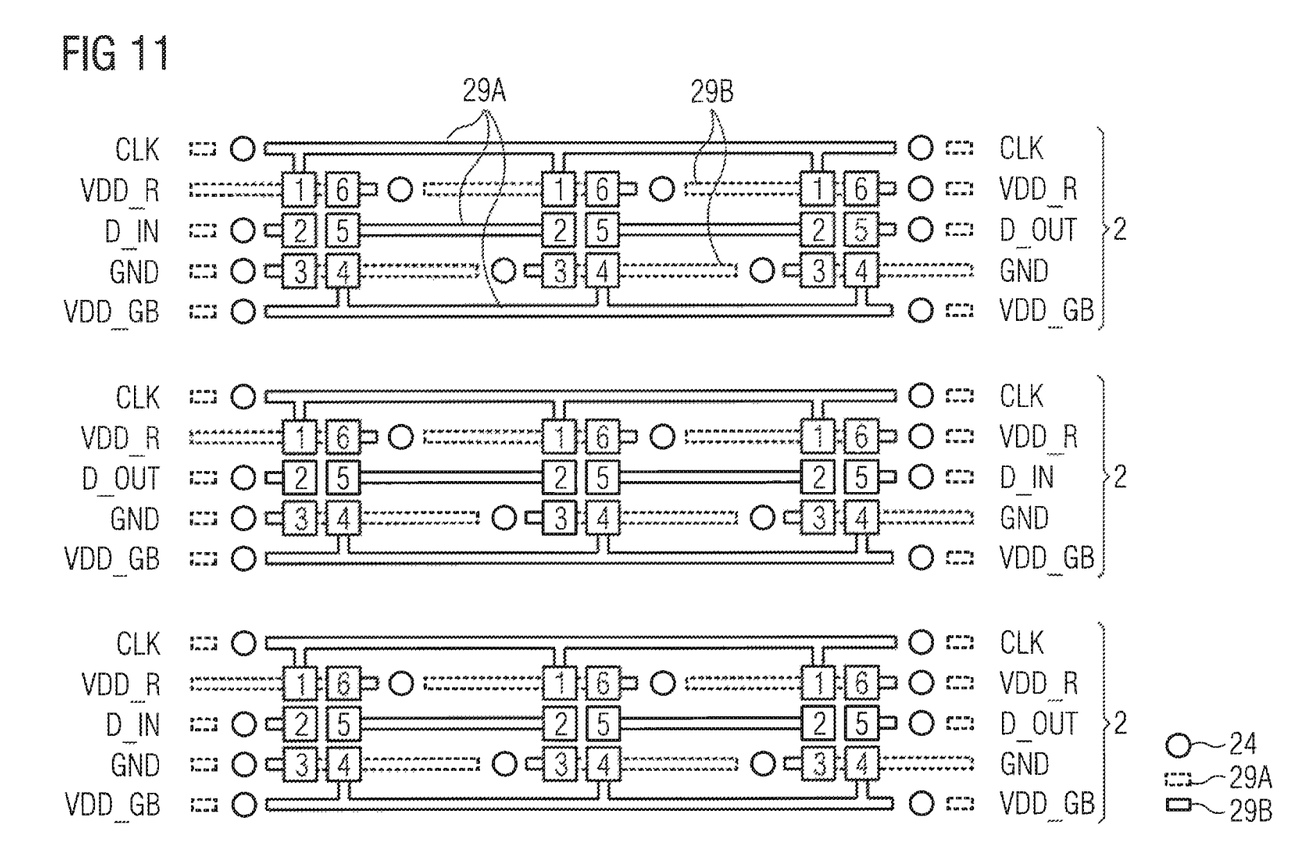

An interconnection for the semiconductor components 2 corresponding to FIG. 10 is also illustrated in FIG. 11. In this case, the electrical connections 29 run to the connections 24 preferably in two planes so that the connections 29A can lie in a first plane and the connections 29B can lie in a second plane. In order to reduce a distance between adjacent connections 29A, 29B in a plan view, the connections 24 which are designed as plated-through holes can be arranged offset with respect to one another.

Such a circuitry, as illustrated in FIGS. 10 and 11, which provides six of the connections 24 per semiconductor component 2, can also be used in the same way in all the exemplary embodiments, too.

In particular in the exemplary embodiments of FIGS. 1 to 7, the semiconductor components 2 are designed with a circular contour when viewed in plan view. In contrast, FIG. 12 illustrates that polygonal basic shapes can also be present, wherein preferably rounded corners are applied.

Figure 12A:
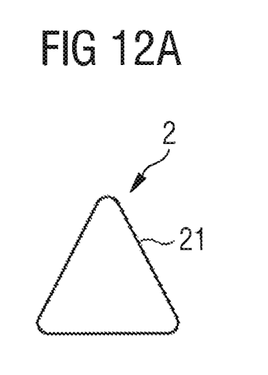
Figure 12B:
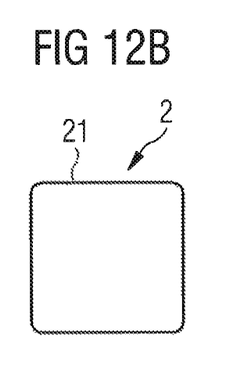
Figure 12C:
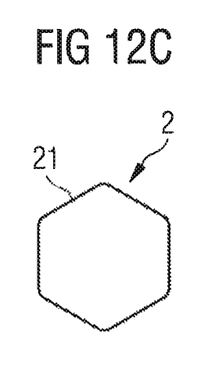

Accordingly, in FIG. 12A the semiconductor component 2 has a ground plot in the form of an equilateral triangle. In FIG. 12B, a square or rectangular ground plot with rounded corners is shown. In FIG. 12C, the semiconductor components 2 have a ground plot in the form of a regular hexagon with rounded corners.

Figure 13:
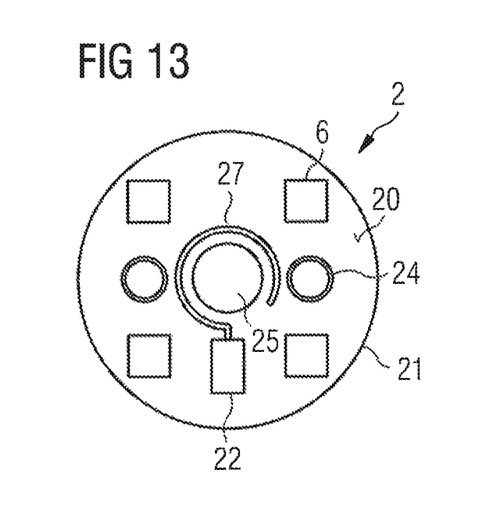

In the exemplary embodiment of FIG. 13, an antenna 27 is additionally present. Radio control of the semiconductor component 2 is possible via the antenna 27. The antenna 27 is formed, for example, as a double-wire loop which can surround the fastening hole 25 and which is connected to the control unit 22. The semiconductor component 2 is supplied with energy via the contact threads, not shown in FIG. 13, which are to be connected to the two contact holes 24.

Figure 14A:
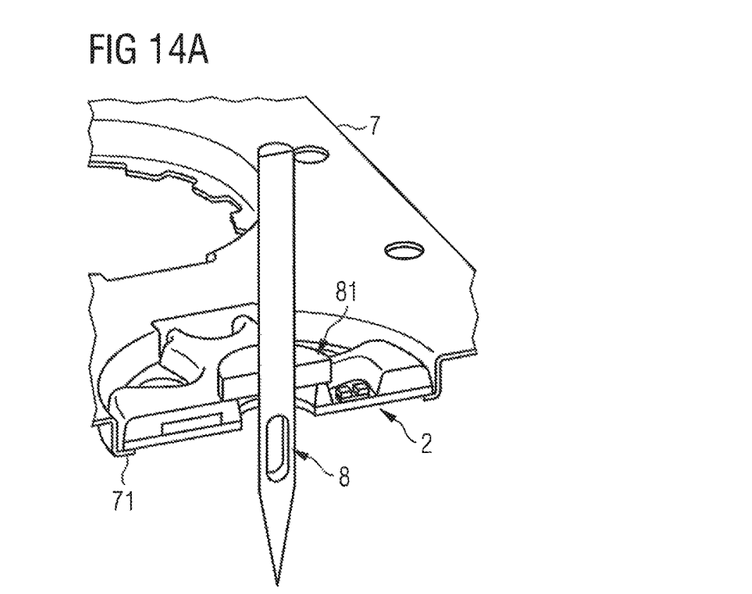
Figure 14B:
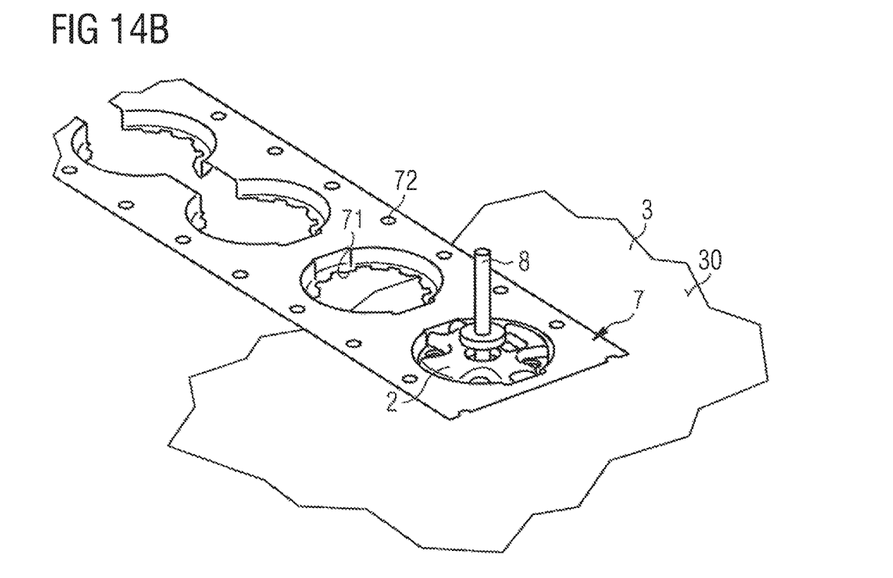

FIG. 14 schematically illustrates a production method for display devices 1. In this case, the semiconductor components 2, see FIG. 14B, are provided in an endless belt 7. Fastening noses 71 are located in the belt 7, through which the semiconductor components 2 are pressed out of the belt 7 in the direction towards the support 3.

Furthermore, guide holes 72 are optionally present on one or, preferably, on both sides of the belt. In particular by means of the guide holes 72, it is possible to divide the belt 7 after the semiconductor components 2 have been pressed out. This is indicated in the right-hand region of FIG. 14B; for reasons of clarity, however, the separation of the belt 7 directly on the semiconductor component 2 still located in the belt 7 is not shown. By dividing the belt 7, the threads 4, 5 can be guided laterally out of the belt 7 so that the stitching is simplified.

In contrast to the representation in FIG. 14B, after dividing, the belt 7 can also be bent apart considerably more strongly and/or bent away from the support 3 by means of the guide holes 72, in order to further simplify the guiding of the threads. Furthermore, it is possible for the pressed-out belt part to be separated, in contrast to the drawing.

As a result of the use of such a belt 7, many of the semiconductor components 2 can be stitched closely next to one another at high speed.

An embroidery needle 8 is illustrated by way of example in FIG. 14A. The embroidery needle 8 has a disk-shaped push-out 81, which is made of a soft material such as rubber. By means of the push-out 81, the semiconductor components 2 are pressed onto the support 3 without damage via the fastening noses 71. Preferably, the stitching of the semiconductor components 2 to the support 3 begins at the same time.

Figure 15:
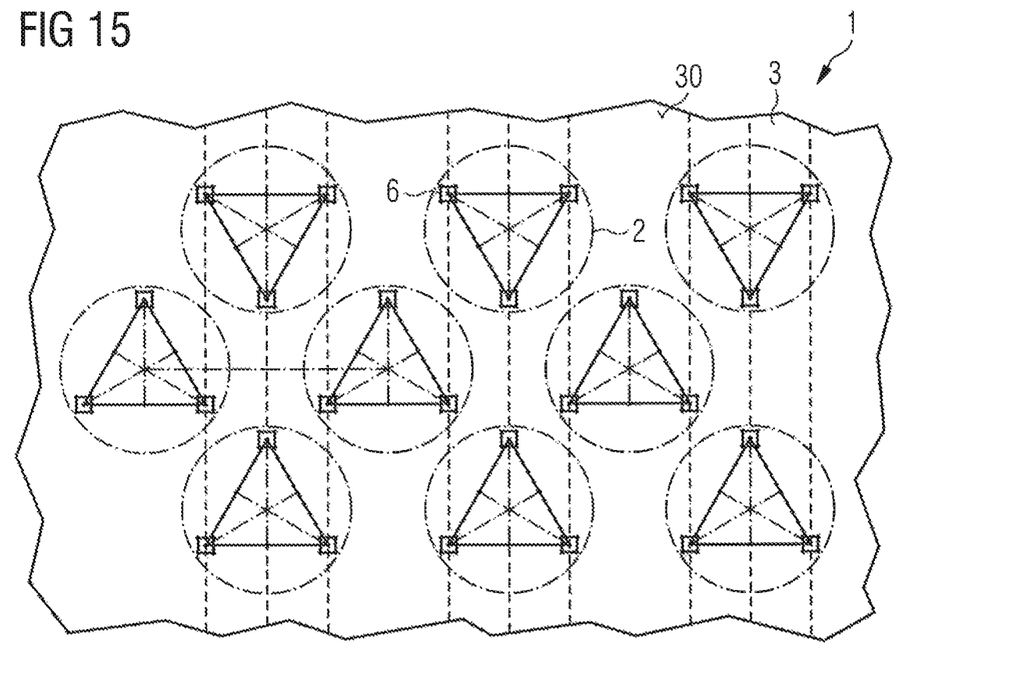

FIG. 15 shows that the only schematically drawn semiconductor components 2 each have three of the image points 6. The image points 6 are each arranged in an equilateral triangle. Both the image points 6 and the semiconductor components 2 can be arranged in a hexagonal or approximately hexagonal pattern. An arrangement of the semiconductor components 2 alternates, for example, in a two-row rhythm so that the semiconductor components 2 are oriented identically in each two consecutive rows, followed by two rows with an orientation that is in particular rotated by 180°.

Figure 16:
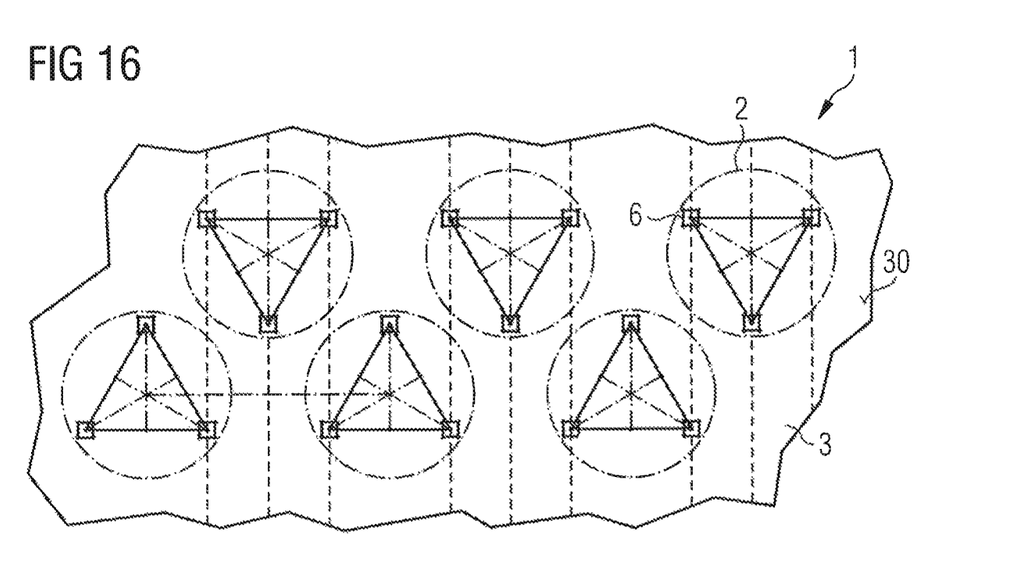

According to FIG. 16, the semiconductor components 2 which are designed as in FIG. 15 are arranged such that both the semiconductor components 2 and the image points 6 are arranged regularly hexagonally at least in adjacent rows. The image points 6 can thus be arranged equidistantly, even over the entire arrangement of the semiconductor components 2. For this purpose, the orientations and the distances of the semiconductor components 2 can be adapted accordingly.

Otherwise, the statements relating to FIGS. 1 to 8 apply accordingly to FIGS. 15 and 16.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

What is claimed is:

1. A display device comprising:
   a flat textile support; and
   a plurality of optoelectronic semiconductor components disposed on the support, each semiconductor component comprising:
      a connection substrate comprising a plurality of electrical connections, the plurality of electrical connections electrically connected via electrically conductive contact threads,
      wherein each electrical connection is realized by a contact hole which completely penetrates through the semiconductor component and, viewed in a plan view, is surrounded all around by the connection substrate, and
      wherein, in each case, at least one contact thread runs through the contact hole so that the contact thread is arranged in part on an upper side of the semiconductor component facing away from the support;
      a plurality of semiconductor chips for generating light; and
      at least one control unit for adjusting a color location of the generated light,
   wherein the semiconductor components are stitched onto the support.

2. The display device according to claim 1, wherein the optoelectronic semiconductor components are sequins.

3. The display device according to claim 1, wherein each semiconductor component has a plurality of image points that are independently electrically controllable of one another so that the semiconductor chips are grouped into the image points.

4. The display device according to claim 3,
   wherein the image points are arranged in a uniform, regular pattern over the semiconductor components,
   wherein the semiconductor components are arranged offset with respect to one another so that the semiconductor components are arranged in a different basic pattern than the image points, and
   wherein the image points are RGB units in each case.

5. The display device according to claim 1,
   wherein each semiconductor component has n×n image points, and
   wherein $n \in \{2; 4; 6\}$.

6. The display device according to claim 1, wherein each semiconductor component has at least one electrically passive fastening hole through which at least one electrically non-conductive fastening thread runs.

7. The display device according to claim 6, wherein the fastening hole is arranged centrally in the semiconductor component and has a larger diameter than the contact holes.

8. The display device according to claim 1,
   wherein at least some of the semiconductor components are electrically connected in series via at least some of the contact threads, and
   wherein the respective contact threads, viewed in plan view, do not cross and each runs oblique to straight arrangement lines of the semiconductor chips.

9. The display device according to claim 1, wherein each semiconductor component comprises between three and six of the electrical connections which are electrically contact-connected to the contact threads by stitching.

10. The display device according to claim 1,
    wherein at least one electrical conductor track is arranged on an outer side of the support facing the semiconductor components to which at least one of the electrical connections of the respective semiconductor components is electrically contacted, and
    wherein the conductor track has an enlarged thickness in a region of the electrical connections.

11. The display device according to claim 1, wherein a basic shape of the semiconductor components, seen in plan view, is circular or a regular polygon, and wherein a number of corners of the polygon is between three and eight inclusive and the corners are rounded.

12. The display device according to claim 1,
    wherein each semiconductor component has at least two fixing notches at an outer edge for fixing an orientation of the semiconductor components at the support, and
    wherein the fixing notches are electrically insulating.

13. The display device according to claim 1,
    wherein the contact threads are composed of a plurality of fibers and have an average diameter of between 50 μm and 0.3 mm inclusive,
    wherein an average diameter of the semiconductor components is between 3 mm and 7 mm inclusive, and an average diameter of the connections is between 0.3 mm and 2 mm inclusive,
    wherein each fiber has an electrically insulating fiber core and an electrically conductive fiber casing, and
    wherein between 10 and 1000 of the semiconductor components are attached to the support.

14. The display device according to claim 1, wherein at least a part of the semiconductor components comprise an antenna for receiving control signals so that the respective semiconductor component is configured for a radio control.

15. The display device according to claim 1,
wherein the semiconductor components are located between the support and a covering material,
wherein the covering material comprises at least one conductor track which is electrically connected to at least some of the semiconductor components,
wherein the covering material is light-transmissive and light-scattering, and
wherein the covering material is a foil or a textile.

16. A method for producing the display device according to claim 1, the method comprising:
providing the support and the semiconductor components; and
stitching the semiconductor components onto the support,
wherein both a mechanical fastening and an electrical contacting of the semiconductor components are carried out during the stitching.

17. The method according to claim 16, further comprising:
providing the semiconductor components in at least one belt;
pressing the semiconductor components out of the belt; and
stitching the semiconductor components to the support with an embroidery needle that comprises a push-out.

* * * * *